US007286367B2

(12) United States Patent
Miyake et al.

(10) Patent No.: US 7,286,367 B2
(45) Date of Patent: Oct. 23, 2007

(54) PRINTED CIRCUIT BOARD WITH A BUILT-IN PASSIVE DEVICE, MANUFACTURING METHOD OF THE PRINTED CIRCUIT BOARD, AND ELEMENTAL BOARD FOR THE PRINTED CIRCUIT BOARD

(75) Inventors: Toshihiro Miyake, Inuyama (JP); Satoshi Takeuchi, Nagoya (JP); Koji Kondo, Toyohashi (JP); Toshikazu Harada, Kariya (JP); Masayuki Aoyama, Kariya (JP); Yoshitaro Yazaki, Anjo (JP); Kazuo Tada, Kariya (JP); Yoshihiko Shiraishi, Nagoya (JP); Yosuke Ozaki, Kokubunji (JP); Katsumi Yamazaki, Kokubunji (JP); Seiji Konishi, Yokohama (JP); Seiichi Shindou, Yamato (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 10/339,655

(22) Filed: Jan. 10, 2003

(65) Prior Publication Data
US 2003/0133275 A1 Jul. 17, 2003

(30) Foreign Application Priority Data
Jan. 11, 2002 (JP) ............................. 2002-004672
Mar. 6, 2002 (JP) ............................. 2002-060797
Jul. 31, 2002 (JP) ............................. 2002-223645

(51) Int. Cl.
*H05K 1/16* (2006.01)
(52) U.S. Cl. .................................................... 361/765
(58) Field of Classification Search ........ 361/760–766, 361/792–795, 782–784, 301.1, 306.3, 303; 174/254–262; 29/840–843; 428/209–210
See application file for complete search history.

(56) References Cited

U.S. PATENT DOCUMENTS 5,172,304 A 12/1992 Ozawa et al.
5,428,499 A * 6/1995 Szerlip et al. ............... 361/328

(Continued)

FOREIGN PATENT DOCUMENTS

EP WO 91/11025 7/1991

(Continued)

OTHER PUBLICATIONS

Examination Report dated Aug. 26, 2005, In App. No. GB0300588.1.

(Continued)

*Primary Examiner*—Tuan T. Dinh
(74) *Attorney, Agent, or Firm*—Posz Law Group, PLC (57) ABSTRACT

A multilayer printed circuit board with a built-in capacitor includes a plurality of resin films, each of which is made of thermoplastic resin and has a plurality of via-holes at predetermined positions, a plurality of conductive patterns, which are located on the resin films, and a plurality of conductive pattern interconnecting members, which are located in the via-holes to electrically interconnect the conductive patterns that are electrically separated by the resin films. Two of the conductive patterns are respectively located on two surfaces, which are opposite to each other, of one of the resin films while overlapping. The two of the conductive patterns and the one of the resin films make up a capacitor.

20 Claims, 5 Drawing Sheets

U.S. PATENT DOCUMENTS

| | | | |
|---|---|---|---|
| 5,745,334 A | | 4/1998 | Hoffarth et al. |
| 5,785,879 A | * | 7/1998 | Kawamura et al. ............ 216/95 |
| 5,796,587 A | * | 8/1998 | Lauffer et al. .............. 361/763 |
| 5,855,711 A | * | 1/1999 | Araki et al. ............. 156/89.16 |
| 5,896,650 A | * | 4/1999 | Nishide et al. ................ 29/830 |
| 6,021,050 A | | 2/2000 | Ehman et al. |
| 6,150,456 A | | 11/2000 | Lee et al. |
| 6,228,467 B1 | | 5/2001 | Taniguchi |
| 6,232,042 B1 | | 5/2001 | Dunn et al. |
| 6,323,096 B1 | | 11/2001 | Saia et al. |
| 6,329,603 B1 | * | 12/2001 | Japp et al. ................... 174/255 |
| 6,387,990 B1 | * | 5/2002 | Yeager ........................ 523/434 |
| 6,485,999 B1 | | 11/2002 | Boone et al. |
| 6,597,583 B1 | * | 7/2003 | Sasaki ......................... 361/761 |
| 6,713,162 B2 | * | 3/2004 | Takaya et al. ............... 428/209 |
| 6,734,542 B2 | * | 5/2004 | Nakatani et al. ............. 257/687 |
| 2002/0117743 A1 | | 8/2002 | Nakatani et al. |

FOREIGN PATENT DOCUMENTS

| | | |
|---|---|---|
| EP | 0 491 542 A1 | 6/1992 |
| EP | 1 267 596 A2 | 12/2002 |
| EP | 1 267 597 A2 | 12/2002 |
| JP | A-S62-210693 | 9/1987 |
| JP | A-H10-190241 | 7/1998 |
| JP | A-H11-312868 | 11/1999 |
| JP | A-2002-280744 | 9/2002 |
| KR | 1996-0027951 | 8/1996 |

OTHER PUBLICATIONS

Examination Report from Great Britain Patent Office issued on Mar. 20, 2006 for the corresponding Great Britain patent application No. GB0602022.6 (a copy thereof).

Office Action from Japanese Patent Office issued on Apr. 4, 2007 for the corresponding Japanese patent application No. 2002-223645 (a copy thereof with English Translation).

* cited by examiner

PRINTED CIRCUIT BOARD WITH A BUILT-IN PASSIVE DEVICE, MANUFACTURING METHOD OF THE PRINTED CIRCUIT BOARD, AND ELEMENTAL BOARD FOR THE PRINTED CIRCUIT BOARD

CROSS REFERENCE TO RELATED APPLICATION

This application is based on and incorporates herein by reference Japanese Patent Applications No. 2002-4672 filed on Jan. 11, 2002, No. 2002-60797 filed on Mar. 6, 2002, and No. 2002-223645 filed on Jul. 31, 2002.

BACKGROUND OF THE INVENTION

The present invention relates to a printed circuit board (PCB) with a built-in passive device, which is buried within the PCB, to a method for manufacturing the PCB, and to an elemental board for the PCB.

Multilayer PCBs in which semiconductor devices or electrical devices such as a capacitor and a resistor are buried are proposed to increase the device density and reduce the dimensions of the PCBs.

For example, JP-A-11-312868 discloses that kind of multilayer PCB. In the publication, a multilayer PCB is manufactured as follows. First, a plurality of insulating layers are formed. Each insulating layer includes a thermosetting resin film in B stage, or unhardened state. Each resin film has via-holes and wiring patterns. Then, the insulating layers and a resin film that includes an electrical device are stacked to form a stacked body. After that, the stacked body is heated to harden the thermosetting resin films, and a multilayer PCB with a built-in electrical device is completed.

Specifically, in the publication, for example, a capacitor is built in a multilayer PCB as follows. First, copper films are formed by plating on both sides of a polyimide film that has a glass transition temperature above the curing temperature of thermosetting resin films of insulating layers at a later step. Then, the copper films are patterned into predetermined shapes to form film-shaped capacitors. The polyimide film with the film-shaped capacitors is aligned with and placed on one of the insulating layers, and the polyimide film and the insulating layers are stacked for forming a stacked body. The stacked body is heat pressed to complete the multilayer PCB with a built-in capacitor.

In the method of the publication, insulating layers and a resin film that includes an electrical device are stacked, so the electrical device needs to be formed before the stacking. As a result, extra manufacturing steps are required for forming the electrical devices beforehand, and the multilayer PCB of the publication may be overly complex. In addition, the electrical device needs to be formed using a film that has high thermal resistance enough to remain intact at the hardening temperature of the thermosetting resin films of the insulating layers. Therefore, the materials that can be used for the thermosetting resin films are limited.

SUMMARY OF THE INVENTION

The present invention has been made in view of the above aspects with an object to provide a multilayer PCB with a built-in electrical device such as a capacitor and a resistor, the structure and the manufacturing process of which are relatively simple, and to a method for manufacturing the multilayer PCB.

A first aspect of the present invention is a multilayer PCB with a built-in capacitor and a method for manufacturing the multilayer PCB. The multilayer PCB with a built-in capacitor includes a plurality of resin films, a plurality of conductive patterns, and a plurality of conductive pattern interconnecting members. Each of the resin films is made of thermoplastic resin and has a plurality of via-holes at predetermined positions. The conductive patterns are located on the resin films. The conductive pattern interconnecting members are located in the via-holes to electrically interconnect the conductive patterns that are electrically separated by the resin films. Two of the conductive patterns are respectively located on two surfaces, which are opposite to each other, of one of the resin films while overlapping. The two of the conductive patterns and the one of the resin films make up a capacitor.

A second aspect of the present invention is a multilayer PCB with a built-in resistor and a method for manufacturing the multilayer PCB. The multilayer PCB with a built-in resistor includes a plurality of resin films, a plurality of conductive patterns, and a plurality of conductive pattern interconnecting members. Each of the resin films is made of thermoplastic resin and has a plurality of via-holes at predetermined positions. The conductive patterns are located on the resin films. The conductive pattern interconnecting members are located in the via-holes to electrically interconnect the conductive patterns that are electrically separated by the resin films. The conductive patterns include a low resistivity conductive pattern and a high resistivity conductive pattern, which has resistivity higher than the low resistivity conductive pattern to make up a resistor.

A third aspect of the present invention is another multilayer PCB with a built-in resistor and a method for manufacturing the multilayer PCB. The another multilayer PCB with a built-in resistor includes a plurality of resin films, a plurality of conductive patterns, and a plurality of conductive pattern interconnecting members. Each of the resin films is made of thermoplastic resin and has a plurality of via-holes at predetermined positions. The conductive patterns are located on the resin films. The conductive pattern interconnecting members are located in the via-holes to electrically interconnect the conductive patterns that are electrically separated by the resin films. The conductive pattern interconnecting members includes a low resistivity conductive pattern interconnecting member and a high resistivity conductive pattern interconnecting member that makes up a resistor.

A fourth aspect of the present invention is an elemental board for forming a multilayer PCB with a built-in capacitor. The elemental board includes a film, which includes thermoplastic resin and has a dielectric constant of 4 or greater, and a metal foil, which is located on a surface of the film.

A fifth aspect of the present invention is an elemental board for forming a multilayer PCB with a built-in resistor. The elemental board includes a film, which includes thermoplastic resin, and a high resistivity conductive pattern, which is located on a surface of the film.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments.

First Embodiment

Figure 1A:
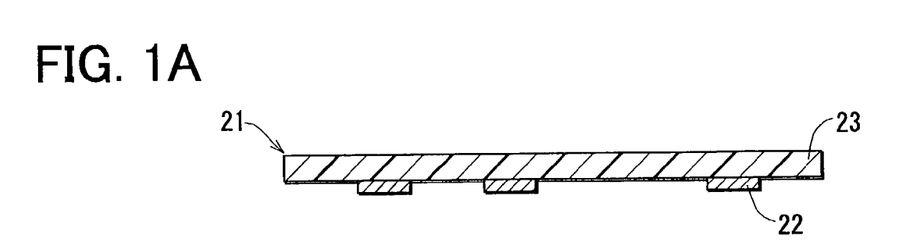
FIGS. 1A to 1E are schematic cross-sectional views showing the manufacturing process of a multilayer PCB with a built-in capacitor according to a first embodiment of the present invention.

As shown in FIG. 1A, an elemental board, or a single-sided conductive pattern film 21, for forming a multilayer PCB with a built-in capacitor includes a resin film 23 and a plurality of low resistivity conductive patterns 22. The conductive patterns 22 are shaped by etching a copper foil with a thickness of 18 μm, which is plastered on a surface of the resin film 23. In FIG. 1A, the resin film 23 is a thermoplastic film with a thickness of 75 μm and is made of a mixture of 65-35 weight % polyetheretherketone resin and 35-65 weight % polyetherimide resin.

Figure 1B:
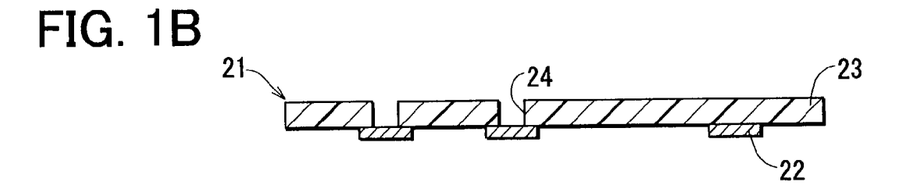

After the conductive patterns 22 are formed as shown in FIG. 1A, a plurality of bottomed via-holes 24 are formed in the resin film 23 by irradiating the resin film 23 with carbon dioxide laser, as shown in FIG. 1B. The via-holes 24 are bottomed by the conductive patterns 22. When the via-holes 24 are irradiated by carbon dioxide laser, the conductive patterns 22 are prevented from being dug by adjusting the power and the exposure time period of the carbon dioxide laser. The diameter of each via-hole 24 is 50-100 μm.

Figure 1C:
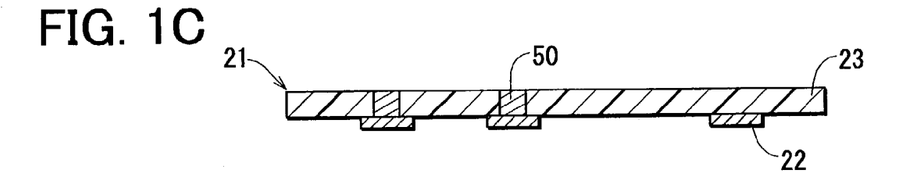

After the via-holes 24 are formed as shown in FIG. 1B, a low resistivity interlayer contact material 50, or a low resistivity conductive paste 50, which is a material for electrical connection, is packed in the via-holes 24, as shown in FIG. 1C. The conductive paste 50 is prepared as follows. A solution, in which 6 g of ethyl cellulose resin is dissolved in 60 g of terpineol, which is organic solvent, is added to 300 g of tin particles with a mean particle size of 5 μm and a specific surface of 0.5 m$^2$/g and 300 g of silver particles with a mean particle size of 1 μm and a specific surface of 1.2 m$^2$/g. The mixture is compounded by a mixer to make it pasty. The ethyl cellulose resin is added to improve the shape-holding ability of the conductive paste 50. As a material for improving the shape-holding ability, acrylic resin may be used.

After the conductive paste 50 is printed and packed in the via-holes 24 of the single-sided conductive pattern film 21 by a screen-printing machine using a metal mask, the terpineol is evaporated at 140-160° C. for about 30 minutes. In FIG. 1C, the screen-printing machine is used for packing the conductive paste 50 into the via-holes 24. Other methods using, for example, a dispenser may be used as long as the packing is ensured.

Instead of terpineol, other organic solvents may be used to make the mixture pasty. Desired organic solvents have a boiling point of 150-300° C. Organic solvents having a boiling point of 150° C. or lower are likely to cause a problem that time-dependent variation of the viscosity of the conductive paste 50 becomes relatively large. On the other hand, organic solvents having a boiling point higher than 300° C. have a problem that the evaporation of the solvents takes relatively long time.

The metal particles included in the conductive paste 50 preferably have a mean particle size of 0.5-20 μm and a specific surface of 0.1-1.5 m$^2$/g. In the case that the metal particles have a mean particle size smaller than 0.5 μm or a specific surface greater than 1.5 m$^2$/g, relatively plenty of organic solvent is required for providing the conductive paste 50 with suitable viscosity for packing the conductive paste 50 into the via-holes 24.

The conductive paste 50 that contains relatively plenty of organic solvent requires relatively long time for the evaporation of the solvent. If the evaporation is insufficient, relatively plenty of gas is generated when the conductive paste 50 is heated during an interlayer connecting period, and voids tend to be generated in the via-holes 24. Therefore, the reliability of interlayer connection is lowered.

On the other hand, in the case that the metal particles have a mean particle size greater than 20 μm or a specific surface smaller than 0.1 m$^2$/g, it becomes difficult to pack the conductive paste 50 into the via-holes 24. In addition, the metal particles tend to be unevenly distributed, so it is difficult to form low resistivity conductive pattern interconnecting members 51, or low resistivity conductive compounds 51, which electrically interconnect the conductive patterns 22, made of homogeneous alloy when the conductive paste 50 is heated.

Thus, it becomes difficult to ensure the reliability of the electrical connection. Before the conductive paste 50 is packed into the via-holes 24, the surfaces of the conductive patterns 22, which are located at the bottoms of the via-holes 24, may be lightly etched or chemically reduced to facilitate the connection, which is described later, between the conductive patterns 22 and the conductive compounds 51 at the bottoms of the via-holes 24.

Figure 1D:
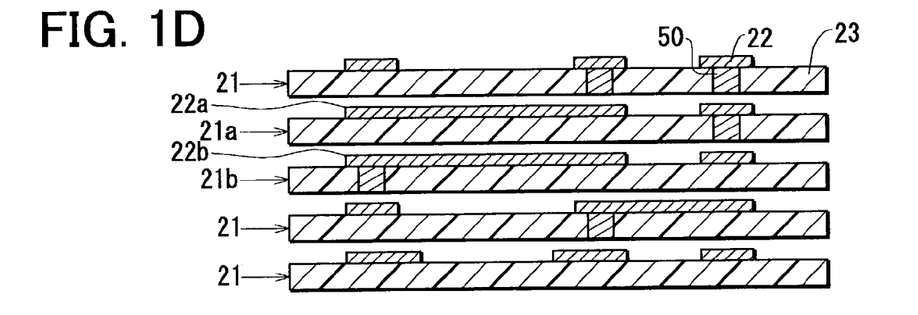

Then, as shown in FIG. 1D, a plurality of the single-sided conductive pattern films 21, 21a, 21b, are stacked such that the conductive patterns 22, 22a, 22b face upward. In other words, the side having the conductive patterns 22, 22a, 22b and the opposite side not having the conductive patterns 22, 22a, 22b of the films 21, 21a, 21b face each other in the stacked body. In FIG. 1D, the number of the films 21, 21a, 21b is five.

As shown in FIG. 1D, a pair of conductive patterns 22a, 22b is located on both sides of the resin film 23 of the single-sided conductive pattern film 21a while overlapping in the stacked body. As described above, each resin film 23 is made of polyetheretherketone resin and polyetherimide resin. Each resin film 23 has a dielectric constant of 3.3.

Therefore, when the pair of conductive patterns 22a, 22b is placed to overlap on both sides of one resin film 23, a capacitor, which includes the pair of conductive patterns 22a, 22b as electrodes and the resin film 23 as a dielectric body, is formed.

The capacitance of the capacitor can be adjusted by changing the dimensions of the pair of conductive patterns 22a, 22b and the thickness of the resin film 23 that is located between the pair of conductive patterns 22a, 22b. In other words, the larger the dimensions of the pair of conductive patterns 22a, 22b, or the thinner the resin film 23 that is located between the pair of conductive patterns 22a, 22b, the greater would be the capacitance. Therefore, a capacitor having a desirable capacitance value can be formed using the pair of conductive patterns 22a, 22b and the resin film 23.

It is preferred that the resin film 23 that is located between the pair of conductive patterns 22a, 22b be thinner than the other resin films 23 included in the stacked body. As described above, the thinner the resin film 23 that is located between the pair of conductive patterns 22a, 22b, the greater would be the capacitance when the dimensions of the conductive patterns 22a and 22b are constant. Therefore, when the resin film 23 that is located between the pair of conductive patterns 22a, 22b is thinner than the other resin films 23 included in the stacked body, the controllable range of the capacitance becomes wider.

The other resin films 23 included in the stacked body need to be thicker than the resin film 23 that is located between the pair of conductive patterns 22a, 22b for the following reason as well. The single-sided conductive pattern films 21, 21a, 21b are integrated by bonding the resin films 23 using the plastic deformation of the resin films 23. Therefore, if the other resin films 23 were too thin, the other resin films 23 would not deform enough to bond the resin films 23 together with sufficient bonding strength.

After the single-sided conductive pattern films 21, 21a, 21b are stacked as shown in FIG. 1D, the stacked body is heat pressed from the top and bottom surfaces of the stacked body by a vacuum hot-press machine, which is not illustrated. Specifically, the stacked body is pressed under 1-10 MPa while being heated at 250 to 350° C. for 10-20 minutes.

Figure 1E:
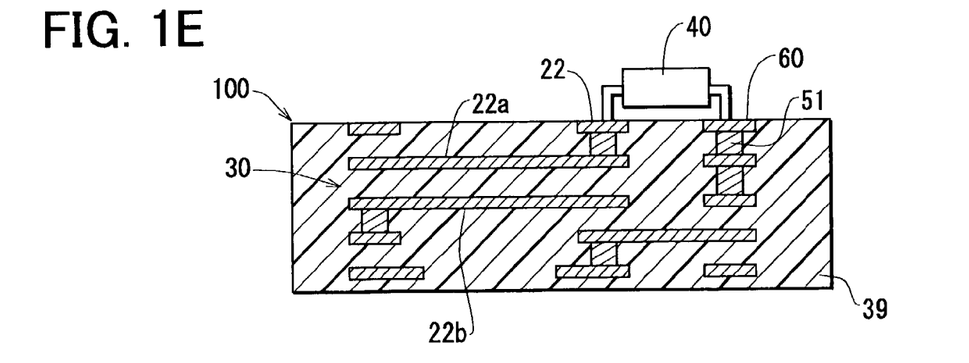

With the heat pressing, as shown in FIG. 1E, the resin films 23 in the single-sided conductive pattern films 21, 21a, 21b deform plastically and adhere to one another. Because the resin films 23 are all made of the same thermoplastic resin, the resin films 23 are easily bonded together to make a single insulating substrate 39.

At the same time, the conductive paste 50 in the via-holes 24 is sintered to make single conductive compounds 51 and create diffusion junctions with the adjoining two conductive patterns 22. As a result, the two adjoining conductive patterns 22 are electrically interconnected. With the above manufacturing steps, a multilayer PCB 100 having a built-in capacitor 30, which is made up of the pair of conductive patterns 22a, 22b and the resin film 23 that is located between the pair of conductive patterns 22a, 22b, is completed.

The interlayer contact mechanism for the conductive patterns 22, 22a, 22b will be briefly described next. The conductive paste 50 packed and evaporated in the via-holes 24 is in the state that tin particles and silver particles are mixed. When the conductive paste 50 is heated at 250-350° C., the tin particles melt, stick to, and cover the surface of the silver particles because the melting point of the tin particles and that of the silver particles are 232° C. and 961° C., respectively.

As the heating is continued in the state that the tin particles and the silver particles are mixed, fused tin begins defusing from the surface of the silver particles and an alloy having a melting point of 480° C. is formed between tin and silver. Due to the formation of the alloy, the conductive compounds 51 made of the alloy are formed in the via-holes 24.

When the conductive compounds 51 are formed in the via-holes 24, each conductive compound 51 is pressed to each surface, which is located at each bottom of the via-holes 24, of the conductive layers 22. Therefore, the tin component in each conductive compound 51 and the copper component in the conductive layers 22 diffuse mutually, and a solid phase diffusion layer is formed at the boundary between each conductive compound 51 and each conductive layer 22.

According to the above manufacturing process, the conductive patterns 22a, 22b that make up the electrodes of the capacitor 30 can be formed at the same time when the conductive patterns 22 are formed from the copper foils. Therefore, no additional manufacturing steps would be required for forming the conductive patterns 22a, 22b that make up the electrodes. Because the dielectric body in the capacitor 30 is made up of one of the resin films 23, which is includes in one of the single-sided conductive pattern films 21 used for forming the multilayer PCB 100, no extra manufacturing steps or special structure would be required for forming the dielectric body.

As the stacked single-sided conductive pattern films 21, 21a, 21b are integrated by heat pressing, the capacitor 30 is also completed. Therefore, according to the manufacturing steps shown in FIGS. 1A to 1E, the multilayer PCB 100 having a built-in capacitor can be formed by simply aligning the pair of conductive patterns 22a, 22b with each other on both sides of one of the resin films 23.

Furthermore, in the multilayer PCB 100 of FIG. 1E, one of the conductive patterns 22a, which is one of the electrodes of the capacitor 30, is located across a single layer of the resin film 23 below the upper surface 60, on which an electronic component 40 is mounted. The other conductive pattern 22b, which is the other electrode of the capacitor 30, is located across only a single layer of the resin film 23 below the one of the conductive patterns 22a such that the conductive patterns 22a, 22b overlap with each other. That is, the capacitor 30 is located below and in the vicinity of the electronic component 40, to which the capacitor 30 is electrically connected. Therefore, the wiring lines between the electronic component 40 and the capacitor 30 is short enough to effectively reduce the electric noises when high frequency signals are transmitted from the electronic component 40 to the capacitor 30.

Especially, the electronic component 40 and the capacitor 30 are electrically connected substantially only by one of the conductive compounds 51 in the multilayer PCB 100 of FIG. 1E. As described earlier, the via holes 24, the diameters of which are 50 to 100 μm, are filled with the conductive compounds 51, which are alloys including tin and silver. Therefore, the conductivity of the conductive compounds 51 is higher than the conductive patterns 22. However, by electrically connecting the electronic component 40 and the capacitor 30 substantially only by one of the conductive compounds 51, the resistance of the wiring lines between the electronic component 40 is prevented from increasing. As a result, the multilayer PCB 100 of FIG. 1E has relatively excellent signal transmission characteristics.

In the multilayer PCB 100 of FIG. 1E, one of the conductive patterns 22 that is located on the surface 60 for mounting the electronic component 40 is also used to electrically connect the electronic component 40 and the conductive compound 51. However, as described earlier, the conductive patterns 22 are so thin that the resistance of the conductive pattern 22 located on the surface 60 is almost negligible when a current flows in the direction in which the thickness of the conductive patterns 22 is defined. As long as the current paths are formed in such a way that the current would not flow through the conductive patterns in parallel to the surface 60 of the multilayer PCB 100, the resistance between the electronic component 40 and the capacitor 30 is substantially determined by the conductive compound 51 alone. Therefore, the wiring paths between the electronic component 40 and the capacitor 30 may also be formed by stacking a plurality of the single-sided conductive pattern films 21 such that the conductive compounds 51 are coaxially aligned with one another and electrically connected by the conductive patterns 22.

In the multilayer PCB 100 of FIG. 1E, the capacitor 30 has a relatively wide controllable range of the capacitance because the resin film 23 that is used to form the capacitor 30 with the pair of conductive patterns 22a, 22b is thinner than the other resin films 23. A similar effect can be achieved, however, by making the dielectric constant of the resin film 23 for the capacitor 30 greater than those of the other resin films.

The dielectric constant of the resin film 23 for the capacitor 30 may be increased, for example, by adding particles made of, for example, barium titanate, lead titanate, or barium tungstenate as a filler only to the resin film 23 for the capacitor. By increasing the dielectric constant of the resin film 23 up to 4 or greater, the capacitor 30 has relatively high capacitance.

In the multilayer PCB 100 of FIG. 1E, only the resin film 23 for the capacitor 30 needs to have high dielectric constant. An elemental board used for manufacturing the capacitor 30 of the multilayer PCB 100, which has a built-in capacitor, can be formed as follows. First, a metal foil made of copper or a metal having a higher resistivity than copper, such as iron, tungsten, nickel, cobalt, zinc, and lead, is plastered on each side or on one side of a resin film having a relatively high dielectric constant. If the metal foil is made of a material having relatively low resistivity like copper, then the metal foil is removed by a method such as etching except for the areas for forming the electrodes of a capacitor or wiring lines. On the other hand, if the metal foil is made of a material having relatively high resistivity, then the metal foil is stripped off except for the areas for forming the electrodes and lands for interlayer electric connections.

It is also possible to use a different type of thermoplastic resin, which has a higher dielectric constant than the other resin films, only for the film for forming a capacitor.

FIGS. 6A to 6E show the manufacturing process of another multilayer PCB with a built-in capacitor according to the first embodiment of the present invention.

Figure 6A:
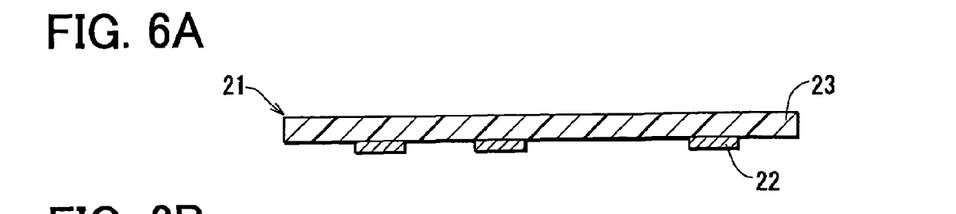
FIGS. 6A to 6E are schematic cross-sectional views showing the manufacturing process of another multilayer PCB with a built-in capacitor according to the first embodiment of the present invention.
Figure 6B:
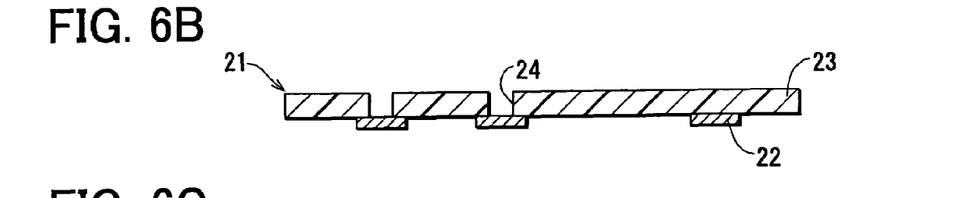
Figure 6C:
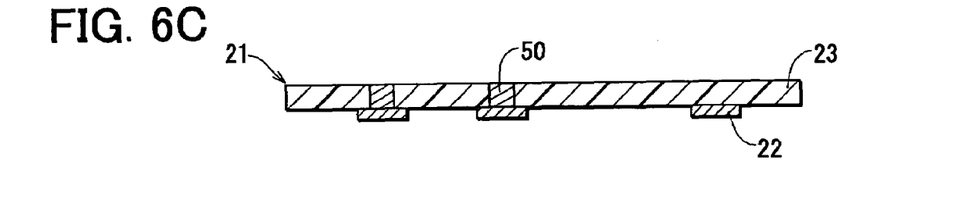
Figure 6D:
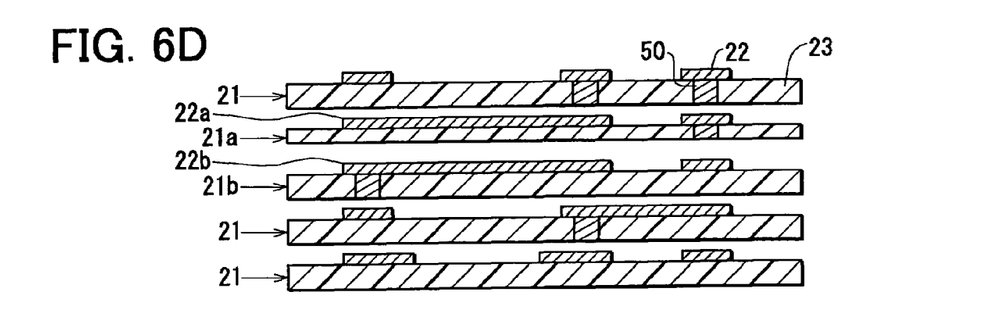
Figure 6E:
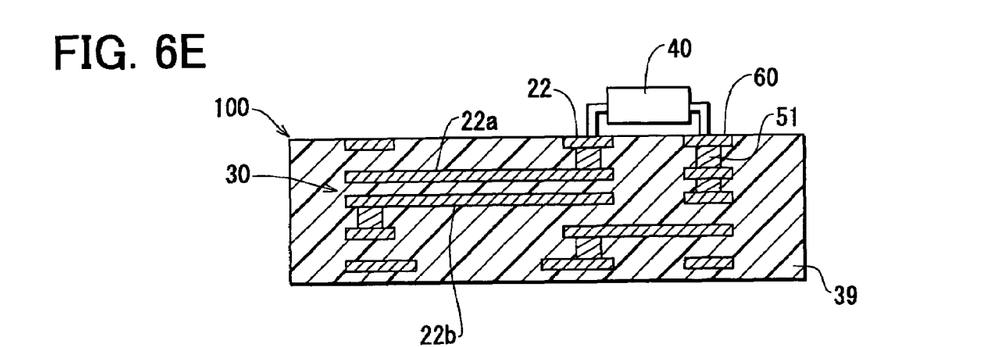

The multilayer PCB 100 includes the built-in capacitor 30. As shown in FIG. 6D, one of the resin films is thinner than the rest of the resin films. The capacitor 30 is composed of a pair of conductive patterns 22a, 22b and the resin film 23 of the single-sided conductive pattern flim 21a. The film 21a has a half thickness thereof, compared with the film 21a shown in FIG. 1D. Therefore, the distance between the conductive patterns 22a, 22b is shorter than that of the capacitor 30 shown in FIG. 1. Thus, the capacitor 30 shown in FIG. 6E has a large capacitance, compared with the capacitor shown in FIG. 1E.

Second Embodiment

Figure 2A:
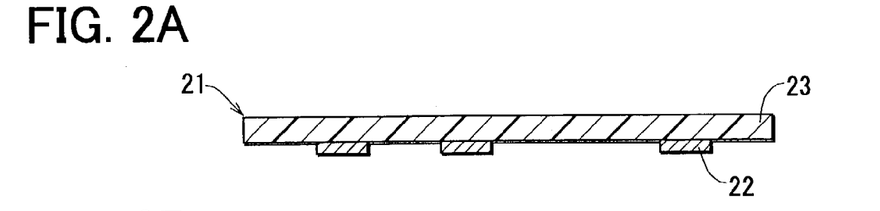
FIGS. 2A to 2E are schematic cross-sectional views showing the manufacturing process of a multilayer PCB with built-in resistors according to a second embodiment of the present invention.
Figure 2B:
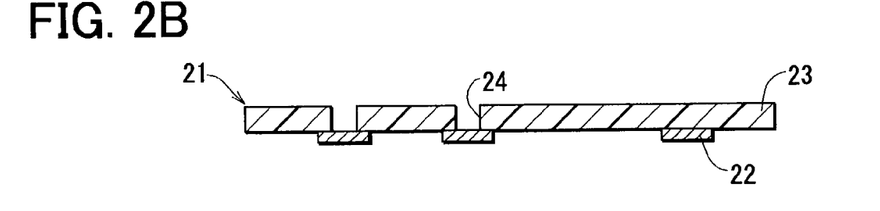
Figure 2C:
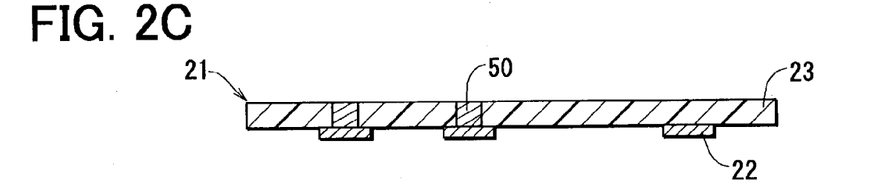
Figure 2D:
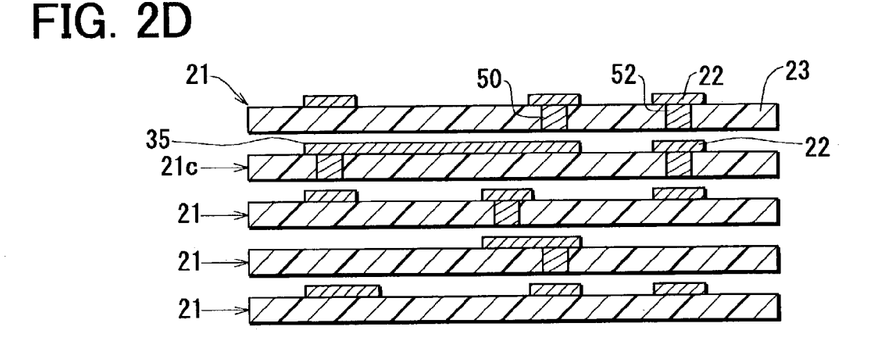
Figure 2E:
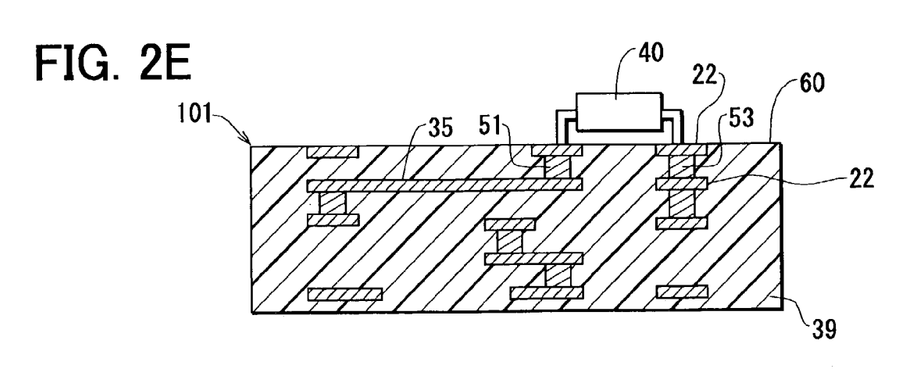

While the multilayer PCB 100 of FIG. 1E includes a capacitor as a built-in passive device, a multilayer PCB 101 of FIG. 2E includes a resistor as a built-in passive device. The steps shown in FIGS. 2A to 2C are the same as the steps shown in FIGS. 1A to 1C. The single-sided conductive pattern films 21 for the multilayer PCB 101 of FIG. 2E are formed by the steps shown in FIGS. 2A to 2C.

The multilayer PCB 101 of FIG. 2E differs from the multilayer PCB 100 of FIG. 1E, however, in that at least one of the elemental boards 21c, or one of the single-sided conductive pattern films 21c, for forming a multilayer PCB with a built-in passive device includes a high resistivity conductive pattern 35, which is formed with a high resistivity material that has higher resistivity, or lower conductivity, than the copper foil used for the low resistivity conductive patterns 22.

Materials such as nickel, a nickel alloy, a carbon paste that contains carbon particles, cobalt, zinc, tin, iron, and tungsten may be used as the high resistivity material. Any material having a conductivity lower than copper may basically be used as the high resistivity material.

The single-sided conductive pattern film 21c, in which the low resistivity conductive patterns 22 and the high resistivity conductive pattern 35 are located separately on a resin film 23, can be formed as follows. Firstly, a copper foil is plastered to a resin film 23 and then stripped off by a method such as etching except for areas where the low resistivity conductive patterns 22 are to be formed. Next, a mask having an opening corresponding to the shape of the resistor being formed is formed on the resin film 23 on the side on which the low resistivity conductive patterns 22 is located. Then, a sheet-shaped resistor made of nickel or a nickel alloy, or a high resistivity conductive pattern 35, is formed by electroless nickel plating and, if necessary, electro nickel plating.

The low resistivity conductive patterns 22 need to have a minimum level of conductivity required for making wiring lines in a circuit. Therefore, each low resistivity conductive pattern 22 has thickness of 9 to 35 μm. On the other hand, the high resistivity conductive pattern 35 is used as a resistor, so the high resistivity conductive pattern 35 has thickness of 0.1 to 35 μm. The resistance of the high resistivity conductive pattern 35 is affected not only by the thickness but also by the width and the length, so the shape of the high resistivity conductive pattern 35 is designed for achieving the desired resistance value.

The multilayer PCB 101 of FIG. 2E also differs from the multilayer PCB 100 of FIG. 1E in that a high resistivity conductive pattern interconnecting member 53, or a high resistivity conductive compound 53, is used as a conductive pattern interconnecting members, in addition to the low resistivity conductive compounds 51, which are made of an alloy including tin and silver.

The high resistivity conductive compound 53 is formed from a high resistivity interlayer contact material 52, or a high resistivity conductive paste 52, which is also used as an interlayer contact material in addition to the low resistivity conductive paste 50. The high resistivity conductive paste 52 is a compounded mixture of conductive particles such as carbon particles, silver particles, and copper particles, a resin for holding the conductive particles, and an organic solvent for making the high resistivity conductive paste 52 pasty. The high resistivity conductive paste 52 is not sintered by heat pressing, but instead turns into the high resistivity conductive compound 53 when the organic solvent simply evaporates. The conductive particles in the high resistivity conductive compound 53, however, do come in to contact with each other due to the pressing of the heat pressing. Therefore, it is possible to control the contact areas between conductive particles and thus adjust the resistance of the high resistivity conductive compound 53 to a predetermined value by adjusting the mixing ratio of the resin to the conductive particles in the mixture.

After the single-sided conductive pattern films 21, 21c are stacked as shown in FIG. 2D, the stacked body is heat pressed from the top and bottom surfaces of the stacked body by a vacuum hot-press machine, which is not illustrated. With the heat pressing, as shown in FIG. 2E, the resin films 23 in the single-sided conductive pattern films 21, 21c adhere to one another. Because the resin films 23 are all made of the same thermoplastic resin, the resin films 23 are easily bonded together to make a single insulating substrate 39.

At the same time, the low resistivity conductive paste 50 in via-holes 24 is sintered and makes single low resistivity conductive compounds 51 to electrically interconnect the low resistivity conductive patterns 22 and the high resistivity conductive pattern 35, and the high resistivity conductive paste 52 makes the high resistivity conductive compound 53. With the above manufacturing steps, a multilayer PCB 101 having built-in resistors, or the high resistivity conductive pattern 35 and the high resistivity conductive compound 53, is completed.

The method of filling the via-holes 24 with the low resistivity conductive paste 50 and the high resistivity conductive paste 52 in the single-sided conductive pattern film 21c will be described.

Figure 3A:
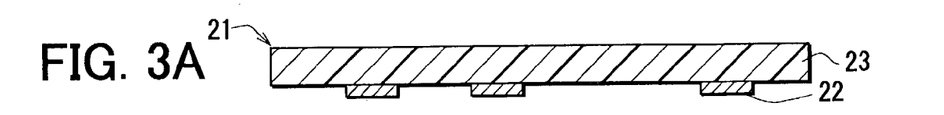
FIGS. 3A to 3H are cross-sectional views showing the steps for filling a plurality of via-holes in a single-sided conductive pattern film with conductive paste and high resistivity paste.
Figure 3B:
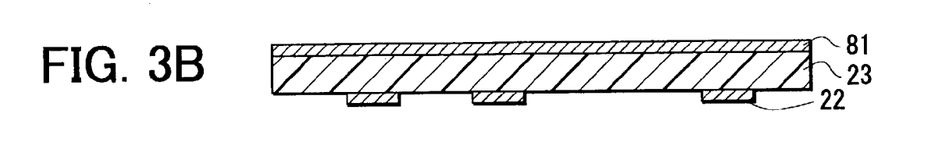

After low resistivity conductive patterns 22 are formed as shown in FIG. 3A by patterning a metal foil plastered on a resin film 23, a first protective sheet 81 is plastered, for example, using a laminator to the resin film 23 on the side opposite to the side on which the low resistivity conductive patterns 22 are formed, as shown in FIG. 3B. The first protective sheet 81 includes a resin layer and an adhesive layer, which is coated on the resin layer on the side at which the first protective sheet 81 is plastered to the resin film 23.

The adhesive material used for the adhesion layer is an UV cured adhesive including an acrylate resin as the main component. A cross-linking reaction takes place in the acrylate resin when the UV cured adhesive is exposed to an UV rays, and the adhesive strength of the adhesive material decreases. In FIG. 3B, the first protective sheet 81 is made of a polyethylenetelephthalate resin film having a thickness of 12 μm and an adhesive layer having a thickness of 5 μm, which is located on the resin film.

Figure 3C:
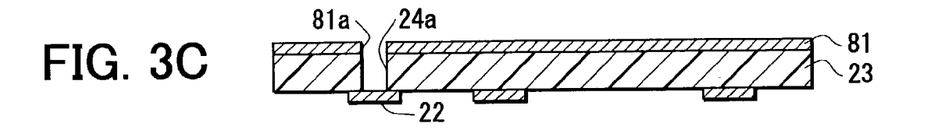

After the first protective sheet 81 is plastered as shown in FIG. 3B, a via-hole 24a, which is bottomed by one of the low resistivity conductive patterns 22, is opened in the resin film 23 by a carbon oxide gas laser irradiation from the side at which the first protective sheet 81 is located, as shown in FIG. 3C. The via-hole 24a will be filled with high resistivity conductive paste 52 at a later step. When the via-hole 24a is formed, an opening 81a, which has substantially the same diameter as the via-hole 24a, is formed in the first protective sheet 81, as shown in FIG. 3C.

Figure 3D:
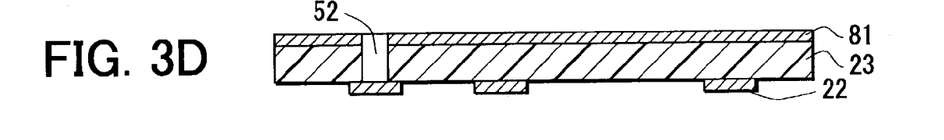

After the via-hole 24a is formed as shown in FIG. 3C, the via-hole 24a is filled with the high resistivity conductive paste 52, which makes a high resistivity conductive compound 53, as shown in FIG. 3D. The high resistivity conductive paste 52 is print filled into the via-hole 24a through the opening 81a in the first protective sheet 81 using, for example, a screen-printing machine. Because the upper surface of the resin film 23 is covered by the first protective sheet 81 as illustrated in FIG. 3B, the upper surface remains clean when the via-hole 24a is filled with the high resistivity conductive paste 52.

Figure 3E:
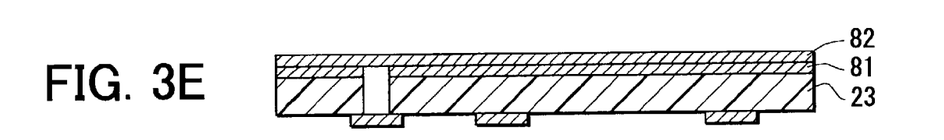

Once the via-hole 24a is filled with the high resistivity conductive paste 52, a second protective sheet 82 is plastered on the first protective sheet 81, as shown in FIG. 3E. As well as the first protective sheet 81, the second protective sheet 82 includes a resin layer and an UV cured adhesive layer, which is coated on the resin layer on the side at which the second protective sheet 82 is plastered to the first protective sheet 81.

Figure 3F:
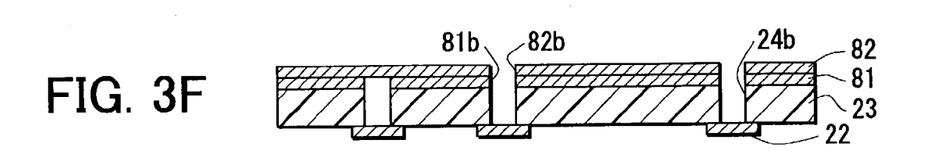

After the second protective sheet 82 is plastered as shown in FIG. 3E, another via-holes 24b, each of which is bottomed by one of the low resistivity conductive patterns 22, is opened in the resin film 23 by a carbon oxide gas laser irradiation from the side at which the second protective sheet 82 is located, as shown in FIG. 3F. The another via-holes 24b will be filled with low resistivity conductive paste 50 at a later step. When the another via-holes 24b are formed, openings 81b, 82b, which have substantially the same diameter as the another via-holes 24b, are formed in the first and second protective sheets 81, 82, as shown in FIG. 3F.

Figure 3G:
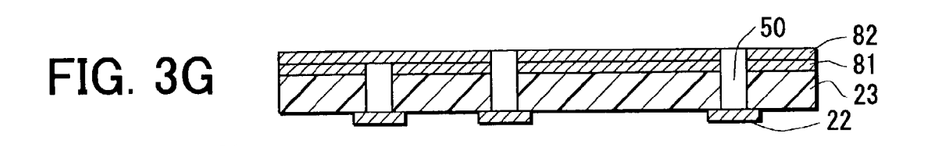

Once the another via holes 24b are opened as shown in FIG. 3F, the another via holes 24b are filled with the low resistivity conductive paste 50, which makes low resistivity conductive compounds 51, as shown in FIG. 3G. Because the via-hole 24a that has been filled with the high resistivity conductive paste 52 is covered by the second protective sheet 82, the low resistivity conductive paste 50 fills the another via-holes 24b without mixing with the high resistivity conductive paste 52.

After the another via-holes 24b are filled with the low resistivity conductive paste 50, the first and second protective sheets 81, 82 are irradiated with UV rays using a UV lamp, which is not illuustrated. With the irradiation, the adhesion layers in the first and second protective sheets 81, 82 are hardened, and the adhesive strength of the adhesive layers decreases.

Figure 3H:
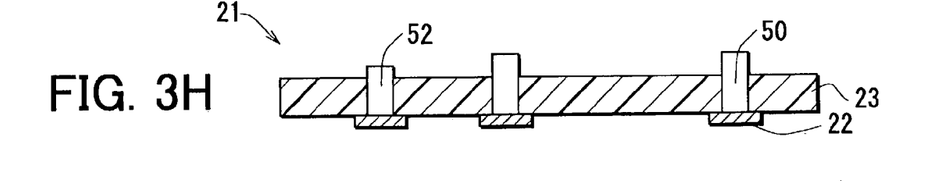

After the UV irradiation to the first and the second protective sheets 81, 82, the first and second protective sheets 81, 82 are stripped off of the single-sided conductive pattern film 21. With the stripping, the single-sided conductive pattern film 21 that includes the resin film 23 having the high resistivity conductive paste 52 and the low resistivity conductive paste 50 in the via-holes 24a, 24b is obtained, as shown in FIG. 3H. With the method shown in FIGS. 2A to 2E and the method shown in FIGS. 3A to 3H, a multilayer PCB 101 with built-in resistors of FIG. 2E can be readily manufactured only by replacing one of the conductive patterns with the high resistivity conductive pattern 35 and replacing one of the low resistivity conductive paste 50 with the high resistivity conductive paste 52.

In the multilayer PCB 101 of FIG. 2E, the high resistivity conductive pattern 35 is separated by only one of the resin films 23 from an electronic component 40 located on the upper surface 60 of the multilayer PCB 101. On the other hand, the high resistivity conductive compound 53 is in contact with one of the low resistivity conductive patterns 22 that is located on the upper surface 60 and another one of the low resistivity conductive patterns 22. That is, the resistors 35, 53 that are respectively formed by the high resistivity conductive pattern 35 and the high resistivity conductive compound 53 are located near and below the electronic component 40, to which the resistors are electrically connected, in order to reduce the effects of electric noises, which would be larger with longer wiring lines between the electronic component 40 and each resistor 35, 53 and degrade the signals being transmitted.

Although the electronic component 40 and the high resistivity conductive pattern 35 are electrically connected substantially only by one of the low resistivity conductive compounds 51 in the multilayer PCB 101 of FIG. 2E, the electronic component 40 and the high resistivity conductive pattern 35, of course, may be electrically connected by a plurality of the low resistivity conductive compounds 51. Even in such an instance, the wiring distance between the high resistivity conductive pattern 35 and the electronic component 40 can be shorten without using the low resistivity conductive patterns 22 for routing the wiring lines.

Although the multilayer PCB 101 of FIG. 2E includes the high resistivity conductive pattern 35 and the high resistivity conductive compound 53, the method for manufacturing the multilayer PCB 101 can be applied to another multilayer PCB that includes the high resistivity conductive pattern 35 alone or the high resistivity conductive compound 53 alone.

Third Embodiment

In the multilayer PCB 101 of FIG. 2E, the low resistivity conductive patterns 22 and the high resistivity conductive patterns 35 were discretely patterned out of a single layer of copper foil and a single layer of high resistivity material.

Figure 4A:
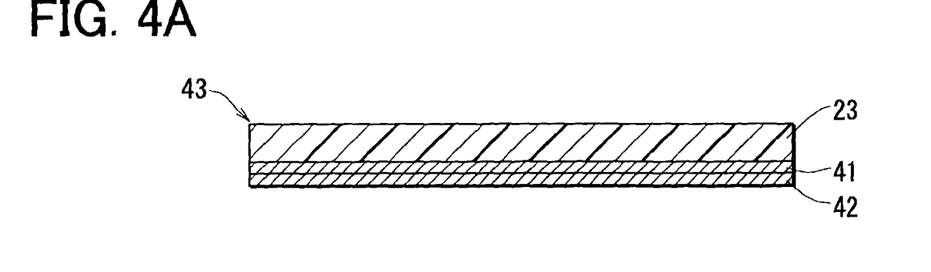
FIGS. 4A and 4B are cross-sectional views showing partly the manufacturing process of a single-sided conductive pattern film that includes a low resistivity conductive pattern and a high resistivity conductive pattern according to a third embodiment of the present invention.
Figure 4B:
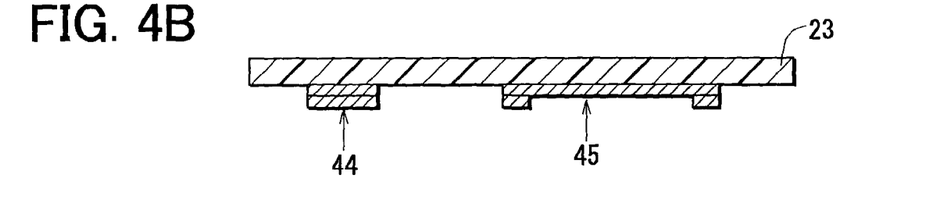

Instead, a low resistivity conductive pattern 44 and a high resistivity conductive patterns 45 may be formed using the method shown in FIGS. 4A and 4B. That is, two layers of conductive foils that respectively have high resistivity and low resistivity are formed on a resin film 23, as shown in FIG. 4A. Then, the low resistivity conductive pattern 44 and the high resistivity conductive pattern 45 are patterned out of the two layers, as shown in FIG. 4B. The method of forming the low resistivity conductive pattern 44 and the high resistivity conductive pattern 45 will be described.

As shown in FIG. 4A, a high resistivity conductive foil 41, which is made of either nickel or a nickel alloy and has a relatively high resistivity, is plastered to a surface of the resin film 23. Then, a low resistivity conductive foil 42, which is made of copper and has a relatively low resistivety, is deposited on the high resistivity conductive foil 41 by electro copper plating.

Once a multilayer member 43, which include a resin film 23, a high resistivity conductive foil 41, and a low resistivity conductive foil 42, is prepared as shown in FIG. 4A, a low resistivity conductive pattern 44, which becomes a wiring line, and a high resistivity conductive pattern 45, which becomes a resistor, are patterned out of the low resistivity conductive foil 42 and the high resistivity conductive foil 41, as shown in FIG. 4B. The conductive foils 41 42 are patterned in two steps because the low resistivity conductive pattern 44 is made up of the conductive foils 41, 42 in the same shape while a portion of the high resistivity conductive pattern 45, which is in a rectangular shape, is made up only of the high resistivity conductive foil 41, as shown in FIG. 4B.

When the low resistivity conductive foil 42 is shaped, the low resistivity conductive foil 42 is not completely stripped off at the area where a high resistivity conductive patterns 45 is formed, but instead, is left at the areas where two ends of the high resistivity conductive patterns 45 is formed, as shown in FIG. 4B. The two pieces of the low resistivity conductive foil 42 that are located on the high resistivity conductive patterns 45 electrically connect the high resistivity conductive patterns 45 to two low resistivity conductive compounds 51 in a single-sided conductive pattern film 21 at a later step. With the two pieces of the low resistivity conductive foil 42, the high resistivity conductive patterns 45 is located at substantially the same level as the low resistivity conductive pattern 44 at the two ends. Therefore, the high resistivity conductive patterns 45 and the low resistivity conductive compounds 51 can be preferably connected.

The low resistivity conductive foil 42, which is made of copper, is shaped by etching using ammonium persulfate aqueous solution as an etchant. The etching rate of nickel, which makes up the high resistivity conductive foil 41, is so lower than that of copper, which makes up the low resistivity conductive foil 42, in the etchant, that the etching time of the low resistivity conductive foil 42 can be controlled easily. In other words, when the low resistivity conductive foil 42 is etched off and the high resistivity conductive foil 41 is exposed to the etchant, the high resistivity conductive foil 41 only gets slightly etched by the etchant because the etching rate of nickel is low enough in comparison with that of copper. Therefore, the etch time can be roughly determined such that the low resistivity conductive foil 42 is completely stripped off.

Then, the high resistivity conductive foil 41, which is made of nickel, is shaped by etching using a mixture of hydrochloric acid, copper sulfate, ethyl alcohol and water as an etchant. Before the later etching, a mask is formed to cover the area where the high resistivity conductive foil 41 is formed and the pieces of the low resistivity conductive foil 42. Therefore, the pieces of the low resistivity conductive foil 42 that have already been patterned by former etching would not get etched by the later etchant.

Then, although not illustrated, via-holes are formed at predetermined positions in the resin film 23, and the single-sided conductive pattern film is completed by filling the via-holes with conductive paste.

The low resistivity conductive patterns 44 of FIG. 4B, which has a double layer structure, is made up of the high resistivity conductive foil 41 and the low resistivity conductive foil 42. However, the current flows in the high resistivity conductive foil 41 substantially in the direction in which the thickness of the high resistivity conductive foil 41 is defined only at the area where the high resistivity conductive foil 41 is in contact with a conductive compound formed from the conductive paste. Therefore, the resistance of the high resistivity conductive foil 41 is almost negligible, and the resistance of the low resistivity conductive pattern 44 is practically determined by the resistance of the low resistivity conductive foil 42.

With the method shown in FIGS. 4A and 4B, the low resistivity conductive pattern 44, which is used for a wiring line, and the high resistivity conductive pattern 45, which is used as a resistor, can be formed relatively easily from the double layers made up of the high resistivity conductive foil 41 and the low resistivity conductive foil 42.

Fourth Embodiment

Figure 5A:
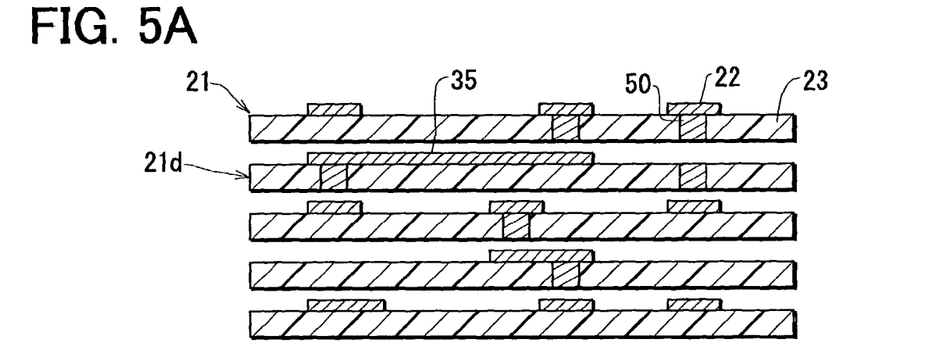
FIGS. 5A and 5B are schematic cross-sectional views showing partly the manufacturing process of a multilayer PCB with a built-in resistor according to a fourth embodiment of the present invention.
Figure 5B:
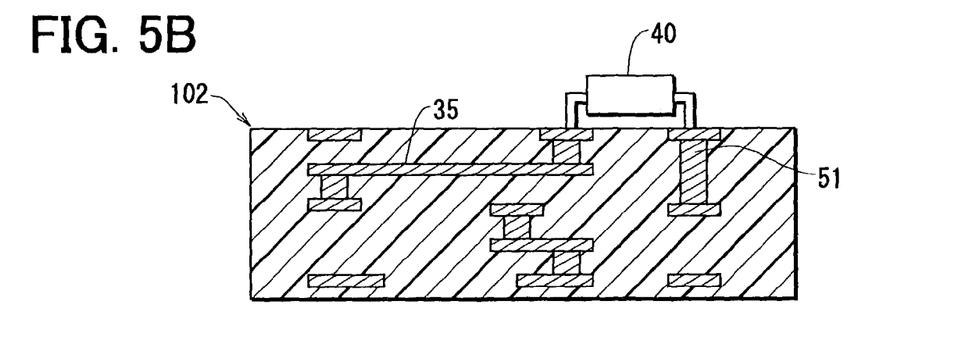

As shown in FIGS. 5A and 5B, in a multilayer PCB 102 according to the fourth embodiment, no low resistivity conductive patterns are included in the elemental boards 21d, or the single-sided conductive pattern film 21d, on which a high resistivity conductive pattern 35 is located.

When the low resistivity conductive pattern 22, 44 and the high resistivity conductive pattern 35, 45 are formed on a surface of one of the resin films 23 as shown in FIGS. 2D and 4B, it is necessary to form the high resistivity conductive patterns 35 using, for example, plating or to conduct the etching twice. On the other hand, the multilayer PCB 102 of FIG. 5B, which includes a built-in resistor, can be manufactured without using an elemental board formed using such a complicated process.

The single-sided conductive pattern film 21d that includes the high resistivity conductive pattern 35 but do not include any low resistivity conductive pattern can be formed in the same manner as shown in FIGS. 1A to 1C. A plurality of single-sided conductive pattern films 21, 21d is stacked, as shown in FIG. 5A. Then, the stacked body is heat pressed to make the multilayer PCB 102 through the mutual adhesion of the single-sided conductive pattern films 21, 21d, in the same manner as described earlier.

If it is necessary to electrically connect two low resistivity conductive patterns 22 that are located above and below the single-sided conductive pattern film 21d that includes the high resistivity conductive pattern 35, a via-hole 24 should be formed beforehand at the position corresponding to the low resistivity conductive paste 50 in the via-hole 24 located in the upper single-sided conductive pattern film 21, the via-hole 24 formed beforehand should be filled with low resistivity conductive paste 50, and an integrated low resistivity conductive compound 51 should be formed by joining directly two pieces of the low resistivity conductive paste 50 located in the two via-holes 24, as shown in FIGS. 5A and 5B.

That is, when the resin films 23 of the single-sided conductive pattern film 21, 21d soften by heat pressing, the two pieces of the low resistivity conductive paste 50 directly contact each other without any low resistivity conductive pattern in-between. When the heat pressing continues in that manner, the two pieces of the low resistivity conductive paste 50 located in the two via-holes 24 sinter together to make the integrated low resistivity conductive compound 51.

Other Embodiments

In the multilayer PCBs 100, 101, 102 of FIGS. 1E, 2E, and 5B, the single-sided conductive pattern films 21, 21a, 21b, 21c, 21d all face the same direction. However, it is also possible to form another multilayer PCB as follows. First, two single-sided conductive pattern films are stacked such that the sides on which the conductive patterns are located face each other. Then, the rest of the single-sided conductive pattern films are stacked on the two single-sided conductive pattern films such that the sides on which the conducting patterns are located of the rest of the single-sided conductive pattern films all face in the same direction. Such a stacking configuration yields a multilayer PCB that permit electronic components to be mounted on its two sides, even though the multilayer PCB is formed using the single-sided conductive pattern films alone, in which the conductive patterns are located only on one side.

Furthermore, another multilayer PCB may also be formed with appropriate combinations of films having conductive patterns on both sides, films having conductive patterns on only one side, or resin films having no conductive patterns. The metal patterns for forming the electrodes of a capacitor and the high resistivity conductive pattern for forming a resistor may be formed on either one side or both sides of a thermoplastic resin film.

Although the resin films 23 used in the multilayer PCBs 100, 101, 102 of FIGS. 1E, 2E, and 5B include 65 to 35 weight % polyetheretherketone (PEEK) resin and 35 to 65 weight % polyetherimide (PEI) resin, other resin films having other composition may be used. For example, the other resin films may be a mixture of polyetheretherketone resin, polyetherimide resin, and a non-conductive filler. Alternatively, the other resin films may include polyetheretherketone alone or polyetherimide alone.

Furthermore, the other resin films may include thermal plastic polyimide or other types of thermoplastic resins such as liquid polymer and polyphynelene sulfide (PPS) instead of polyetheretherketone resin and polyetherimide resin.

Furthermore, while each resin film 23 used in the multilayer PCBs 100, 101, 102 of FIGS. 1E, 2E, and 5B includes the same resin, another multilayer PCB may also be formed with appropriate combinations of resin films that are different from one another in types of resins.

The point is, any type of resin film may be used for multilayer PCBs according to the present invention, as long as the resin film has an elastic modulus of 1 to 1000 MPa at a temperature for heat pressing, which is below the melting point of the resin film; a high thermal resistance enough to withstand the temperature of soldering at a later step; and a dielectric constant higher than a predetermined value if a capacitor is formed as a built-in passive device.

The reason why the resin film should have an elastic modulus of 1 to 1000 MPa is that an elastic modulus higher than 1000 MPa would make the resin films less likely to bond together, and the conductive patterns located on the resin films would be exposed to a high level of stress, which can cause failures like wiring breakage, during heat pressing. On the other hand, if the elastic modulus is less than 1 MPa, the resin films would become so runny during the heat pressing that the low resistivity conductive patterns 22 would be misaligned or the resin film dimensions would be destabilized.

Furthermore, it is preferred that the resin films shrink by 0.2% or smaller when heated to above 200° C. If the resin films shrank by more than 0.2% when heated to more than 200° C., the resin films could locally shrink by an even higher percentage and cause misalignments of the high resistivity conductive patterns 35, 45 or the low resistivity conductive patterns 22, 44, which are located on the resin films, during the heat pressing. Due to the misalignments, the electric connection between the any of the conductive patterns 35, 45, 22, 44 and an adjoining low resistivity conductive pattern 22 can become impossible.

Although the multilayer PCBs 100, 101, 102 of FIGS. 1E, 2E, and 5B includes five single-sided conductive pattern films 21, 21b, 21c, 21d, as a matter of course, the number of the single-sided conductive pattern films 21, 21b, 21c, 21d is not limited to five.

What is claimed is:

1. A multilayer printed circuit board with a built-in capacitor comprising:
  a plurality of resin films, each of which is made of thermoplastic resin and has a plurality of via-holes at predetermined positions, wherein each resin film of a part of the resin films has a via-hole at a predetermined position in the stacking direction;
  a plurality of conductive patterns, which are located on the resin films; and
  a plurality of conductive pattern interconnecting members, which are located in the via-holes to electrically interconnect the conductive patterns, the conductive patterns being electrically separated by the resin films, wherein two of the conductive patterns are respectively located on a first surface and a second surface, which is opposite to the first surface, of one of the resin films, the two conductive patterns overlapping, wherein the entirety of the two of the conductive patterns are not penetrated by the via-holes, wherein the two of the conductive patterns and the one of the resin films make up a capacitor, wherein the via-holes in each of the resin films are separate from the other via-holes in the other resin films, wherein the resin films are capable of being press-bonded with heat so that the resin films are bonded and collectively stacked, wherein the capacitor is provided by the two of the conductive patterns sandwiching only the one of the resin films, wherein the one of the resin films is thinner than the rest of the resin films, wherein the dielectric constant of the one of the resin films is higher than those of the rest of the resin films, and wherein the plurality of resin films includes three or more resin films.

2. The multilayer printed circuit board in claim 1 further comprising an electronic component, which is located on a surface of the multilayer printed circuit board and to which the capacitor is electrically connected through one of the via-holes, wherein an end of the capacitor is located below the electronic component to reduce an electric noise generated in a wiring line between the capacitor and the electronic component.

3. A method for manufacturing a multilayer printed circuit board with a built-in capacitor, the method comprising steps of:

forming a plurality of conductive patterns on each of a plurality of thermoplastic resin films;

forming a plurality of via-holes in each resin film at predetermined positions;

filling each via-hole with an interlayer contact material to form a plurality of elemental boards;

stacking the elemental boards to form a stacked body such that two of the conductive patterns are respectively located on a first surface and a second surface, which is opposite to the first surface, of one of the resin films while overlapping, and wherein the entirety of the two of the conductive patterns are not penetrated by the via-holes; and heat pressing the stacked body to bond the resin films together, to sinter the interlayer contact material in each via-hole to form conductive pattern interconnecting members for electrically interconnecting the conductive patterns, and to build a capacitor, which is made up of the two of the conductive patterns and the one of the resin films, in the stacked body, wherein the one of the resin films is thinner than the rest of the resin films, wherein the dieletric constant of the one of the resin films is higher than those of the rest of the resin films, and wherein the plurality of resin films includes three or more resin films.

4. The method in claim 3 further comprising a step of mounting an electronic component, to which the capacitor is electrically connected, on a surface of the stacked body after the heat pressing, wherein the two of the conductive patterns are formed and arranged such that an end of the capacitor becomes located below and in a vicinity of the electronic component to reduce an electric noise generated in a wiring line between the capacitor and the electronic component.

5. The method in claim 3 further comprising a step of forming the plurality of thermoplastic resin films such that the one of the resin films becomes thinner than the rest of the resin films.

6. The method in claim 3 further comprising a step of forming the plurality of thermoplastic resin films such that the dielectric constant of the one of the resin films becomes higher than those of the rest of the resin films.

7. A multilayer printed circuit board with a built-in resistor comprising:

a plurality of resin films, each of which is made of thermoplastic resin and has a plurality of via-holes at predetermined positions;

a plurality of conductive patterns, which are located on the resin films; and a plurality of conductive pattern interconnecting members, which arc located in the via-holes to electrically interconnect the conductive patterns that are electrically separated by the resin films, wherein the conductive patterns include a low resistivity conductive pattern and a high resistivity conductive pattern, which makes up a resistor, wherein the high resistivity conductive pattern has resistivity higher than the low resistivity conductive pattern, wherein two of the conductive patterns are respectively located on a first surface and a second surface, which is opposite to the first surface, of one of the resin films, the two conductive patterns overlapping, wherein the entirety of the two of the conductive patterns are not penetrated by the via-holes, wherein the one of the resin films is thinner than the rest of the resin films, wherein the dielectric constant of the one of the resin films is higher than those of the rest of the resin films, and wherein the plurality of resin films includes three or more resin films.

8. The multilayer printed circuit board in claim 7 further comprising an electronic component, which is located on a surface of the multilayer printed circuit board and to which the resistor is electrically connected, wherein an end of the resistor is located below and in a vicinity of the electronic component to reduce an electric noise generated in a wiring line between the resistor and the electronic component.

9. The multilayer printed circuit board in claim 7, wherein the low and high resistivity conductive patterns are separated from each other by the one of the resin films.

10. The multilayer printed circuit board in claim 7, wherein the high resistivity conductive pattern includes a high resistivity layer, which substantially determines the resistance of the high resistivity conductive pattern, wherein the low resistivity conductive pattern includes high and low resistivity layers, and wherein the resistance of the low resistivity conductive pattern is substantially determined by the low resistivity layer.

11. The multilayer printed circuit board in claim 10, wherein the high resistivity conductive pattern further includes two low resistivity layers, which are respectively located on two ends of the high resistivity layer of the high resistivity conductive pattern, and wherein two of the conductive pattern interconnecting members are electrically connected to the high resistivity layer of the high resistivity conductive pattern by the two low resistivity layers.

12. A method for manufacturing a multilayer printed circuit board with a built-in resistor, the method comprising steps of:

forming a plurality of conductive patterns on each of a plurality of thermoplastic resin films such that one of the conductive patterns is a high resistivity conductive pattern and the rest of the conductive patterns are low resistivity conductive patterns, wherein two of the conductive patterns are respectively located on a first surface and a second surface, which is opposite to the first surface, of one of the resin films, the two conductive patterns overlapping;

forming a plurality of via-holes in each resin film at predetermined positions;

filling each via-hole with an interlayer contact material to form a plurality of elemental boards;

stacking the elemental boards to form a stacked body; and heat pressing the stacked body to bond the resin films together, to sinter the interlayer contact material in each via-hole to form conductive pattern interconnecting members for electrically interconnecting the conductive patterns, and to build a resistor, which is made up of the high resistivity conductive pattern, in the stacked body, wherein the entirety the two of the conductive patterns are not penetrated by the via-holes, wherein the one of the resin films is thinner than the rest of the resin films, wherein the dielectric constant of the one of the resin is higher than those of the rest of the resin films, and wherein the plurality of resin films includes three or more resin films.

13. The method in claim 12 further comprising a step of mounting an electronic component, to which the resistor is electrically connected, on a surface of the stacked body after the heat pressing, wherein the high resistivity conductive pattern is formed and arranged such that an end of the resistor becomes located below and in a vicinity of the electronic component to reduce an electric noise generated in a wiring line between the resistor and the electronic component.

14. The method in claim 12, wherein the conductive patterns are formed such that the high resistivity conductive pattern and each of the low resistivity conductive patterns are separated from each other by the one of the resin films.

15. The method in claim 12, wherein the high resistivity conductive pattern is formed from high and low resistivity conductive foils such that the resistance of the high resistivity conductive pattern is substantially determined by a high resistivity layer that is formed from the high resistivity conductive foil and wherein the low resistivity conductive patterns are formed from the high and low resistivity conductive foils such that the resistance of the low resistivity conductive pattern is substantially determined by a low resistivity layer that is formed from the low resistivity conductive foil.

16. The method in claim 15, wherein two low resistivity layers are formed respectively from the low resistivity conductive foil on two ends of the high resistivity layer to electrically connect two of the conductive pattern interconnecting members to the high resistivity layer.

17. The multilayer printed circuit board in claim 1, wherein at least one of conductive patterns for making up the capacitor is located on the one of the resin films, on which the other of the conductive patterns connecting to the conductive pattern interconnecting members is disposed.

18. The multilayer printed circuit board in claim 1, wherein the one of the resin films for making up the capacitor is an insulation layer of the capacitor.

19. The multilayer printed circuit board of claim 1, wherein the dielectric constant of the one of the resin films between the two of the conductive patterns is higher than those of the rest of the resin films.

20. The multilayer printed circuit board of claim 1, wherein the one of the resin films does not include a ferroelectric layer.

* * * * *